US005498975A

United States Patent [19]
Cliff et al.

[11] Patent Number: 5,498,975
[45] Date of Patent: Mar. 12, 1996

[54] IMPLEMENTATION OF REDUNDANCY ON A PROGRAMMABLE LOGIC DEVICE

[75] Inventors: Richard G. Cliff, Milpitas; Rina Raman, Fremont; Srinivas T. Reddy, Santa Clara, all of Calif.

[73] Assignee: Altera Corporation, San Jose, Calif.

[21] Appl. No.: 147,601

[22] Filed: Nov. 4, 1993

Related U.S. Application Data

[63] Continuation of Ser. No. 979,003, Nov. 19, 1992, Pat. No. 5,434,514.

[51] Int. Cl.$^6$ ................................................ H03K 19/177
[52] U.S. Cl. ...................... 326/10; 326/38; 326/39; 326/41; 371/8.2
[58] Field of Search .................... 340/825.83, 825.85, 340/825.87; 371/10.1, 10.3, 11.1, 8.1; 307/441, 465, 465.1

[56] References Cited

U.S. PATENT DOCUMENTS

| | | | |
|---|---|---|---|
| 3,805,039 | 4/1974 | Stiffler | 371/8.1 |
| 4,020,469 | 4/1977 | Manning | 340/172.5 |
| 4,047,163 | 9/1977 | Choate et al. | 340/173 R |
| 4,722,084 | 1/1988 | Morton | 371/11.1 |
| 4,791,590 | 12/1988 | Ku et al. | 364/716 |
| 4,845,633 | 7/1989 | Furtek . | |
| 4,870,302 | 9/1989 | Freeman | 307/465 |
| 4,871,930 | 10/1989 | Wong et al. | 307/465 |
| 4,899,067 | 2/1990 | So et al. | 307/465 |
| 5,274,593 | 12/1993 | Proebsting | 371/11.1 |
| 5,369,314 | 11/1994 | Patel et al. | 326/39 |

FOREIGN PATENT DOCUMENTS 963751   7/1964   United Kingdom .

OTHER PUBLICATIONS

"Introducing Redundancy in Field Programmable Gale Arrays" by F. Hatori et al.; Proceedings of the IEEE 1993 Custom Integrated Circuits Conference, held in San Diego, California, May 9–12, 1993, pp. 7.1.1–7.1.4.
*Xilinx: The Programmable Gate Array Data Book 1992*, pp. 1–3 to 1–19, 2–1 to 2–25, and 2–61 to 2–81.
*Xilinx: The XC4000 Data Book, Aug. 1992*, pp. 3–19.
Rose et al., "The Effect of Switch Box Flexibility on Routability of Field Programmable Gate Arrays," submitted to CICC, 1990.

Primary Examiner—Edward P. Westin
Assistant Examiner—Benjamin D. Driscoll
Attorney, Agent, or Firm—Townsend and Townsend and Crew; Vernon A. Norviel; Stephen J. LeBlanc

[57] ABSTRACT

An improved architecture and method of operation for providing redundancy in programmable logic devices. Spare columns or rows of logic blocks 115 and switch boxes 140 are employed to replace columns or rows of logic blocks containing one or more defective logic blocks. Associated logic enable the device to bypass a column or row of logic blocks 115 containing one or more defective logic blocks 115 and to switch in a spare column or row of defect-free logic blocks 115 as replacement.

15 Claims, 4 Drawing Sheets

IMPLEMENTATION OF REDUNDANCY ON A PROGRAMMABLE LOGIC DEVICE

This application is a continuation of application Ser. No. 07/979,003, filed Nov. 19, 1992, now U.S. Pat. No. 5,434,514, of Richard G. Cliff et al. for Programmable Logic Devices With Spare Circuits For Replacement Of Defects.

BACKGROUND OF THE INVENTION

This invention relates to programmable integrated logic circuits. In particular, the invention relates to an improved architecture which implements redundancy capabilities in programmable logic devices.

Programmable logic devices (PLDs), sometimes referred to as PALs, PLAs, FPLAs, PLDs, FPLDs, EEPLDs, LCAs, and FPGAs, are well known. Such devices often comprise a plurality of logic blocks and programmable switch boxes arranged in an array format. Each logic block is configurable to perform user-specified logic operations. Configuration data, which control the logic block functions, are stored in volatile or nonvolatile memory and are loaded at power-up or on command.

It is known in the art that many schemes exist to provide the necessary connections among the logic blocks in a programmable logic device. One scheme involves the use of direct programmable interconnections between adjacent blocks. Special inputs and outputs of adjacent logic blocks can be directly connected via programmable interconnection points. These programmable interconnection points are implemented by programmable switches, such as pass transistors. This scheme is described in detail in the 1992 edition of *The Programmable Gate Array Data Book* by Xilinx, Inc. of San Jose, Calif.

Another scheme described therein employs general purpose interconnect channels, each of which comprises a plurality of vertical and horizontal metal segments. These general purpose interconnect channels are joined by programmable switching boxes. Circuits within these switching boxes permit programmed interconnections among horizontal and vertical segments, forming an interconnect network for the inputs and outputs of the logic blocks. Signals that must travel long distances are routed via long lines which bypass the programmable switching boxes.

It has long been recognized that logic device yield and reliability are inversely correlated with increased complexity. A defective row or column of logic blocks can render the entire array of logic blocks useless even though the remainder of the array is free of defects. Thus, there is desired an architecture which permits defective rows and/or columns of logic blocks to be bypassed and replaced by redundant rows and/or columns of defect-free logic blocks.

SUMMARY OF THE INVENTION

The present invention relates to an improved programmable logic device architecture and method of operation which provides spare columns or spare rows of logic blocks and associated logic to facilitate the replacement of columns or rows of logic blocks containing one or more defective logic blocks.

In one embodiment, programmable multiplexers at the inputs and outputs of the logic blocks enable an array of logic blocks to bypass a column of logic blocks containing one or more defective logic blocks. The configuration data for the column of logic blocks containing one or more defective logic blocks are shifted onto an adjacent column of defect-free logic blocks via a data path. A spare column of defect-free logic blocks is switched in as replacement. Furthermore, programmable multiplexers at programmable switch boxes enable the array to bypass a column of programmable switch boxes associated with the column of logic blocks containing one or more defective logic blocks. A spare column of programmable switch boxes is switched in as replacement.

In another embodiment, an improved programmable logic device comprises a plurality of logic blocks disposed in an array format forming rows and columns of logic blocks. Each logic block performs a variety of user-specified logic operations. At least one row of logic blocks is reserved for replacing a selected row of logic blocks when one or more logic blocks in the selected row of logic blocks are found to be defective.

A further understanding of the nature and advantages of the invention may be realized by reference to the remaining portion of the specification and the attached drawings.

DESCRIPTION OF THE SPECIFIC EMBODIMENTS

Figure 1:
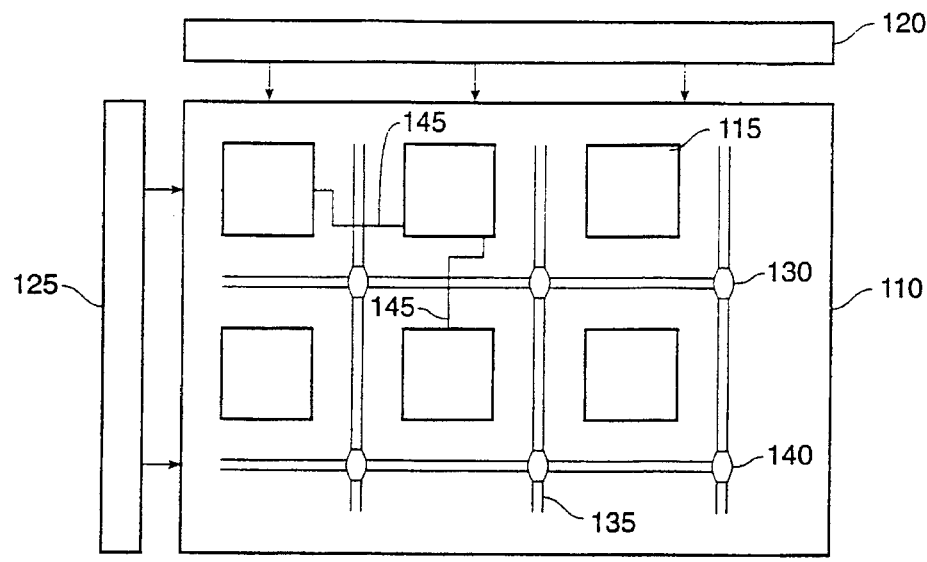
FIG. 1 shows a representative programmable logic device.

FIG. 1 shows a simplified representative programmable logic device (PLD) having horizontal and vertical interconnect buses. A PLD 110 comprises a plurality of logic blocks 115 arranged in a matrix format, forming rows and columns of logic blocks.

Each logic block 115 is configured to implement a variety of user-configured logic functions. A configuration program resides on internal memory cells and is loaded through a data path 120 or an address path 125 upon power-up or on command. A common way to implement logic functions in logic blocks is through the use of programmable look-up tables.

In one embodiment, these programmable look-up tables are SRAM-based. In other words, the function of a particular look-up table is determined by static random-access memory (SRAM) architecture bits. These SRAM bits are programmed upon power up or on command from nonvolatile memory. Preferably, the contents of the SRAM bits are downloaded from an electrically-erasable programmable read-only-memory (EEPROM) which is embedded in the PLD. The SRAM-based programmable look-up tables are more fully described in commonly assigned, co-pending patent application Ser. No. 08/049,064, filed Apr. 19, 1993, (Attorney Docket No. 15114-369).

Interconnect buses, each of which comprises a plurality of metal lines, carry global and local signals to and from each block. Each logic block 115 is instructed to couple one or more of its inputs and outputs to a respective horizontal global interconnect bus 130 or a respective vertical global interconnect bus 135. The coupling can be implemented via, for example, tri-state buffers. A programmable switch box 140 is provided at each intersection of a horizontal global interconnect bus 130 and a vertical global interconnect bus 135.

FIG. 1 also shows a typical local interconnect conductor 145 available to logic block 115. These local interconnect conductors permit efficient coupling of inputs and outputs among neighboring logic blocks 115 and reduce the demand on the global interconnect resources such as horizontal and vertical global interconnect buses 130 and 135.

Figure 2:
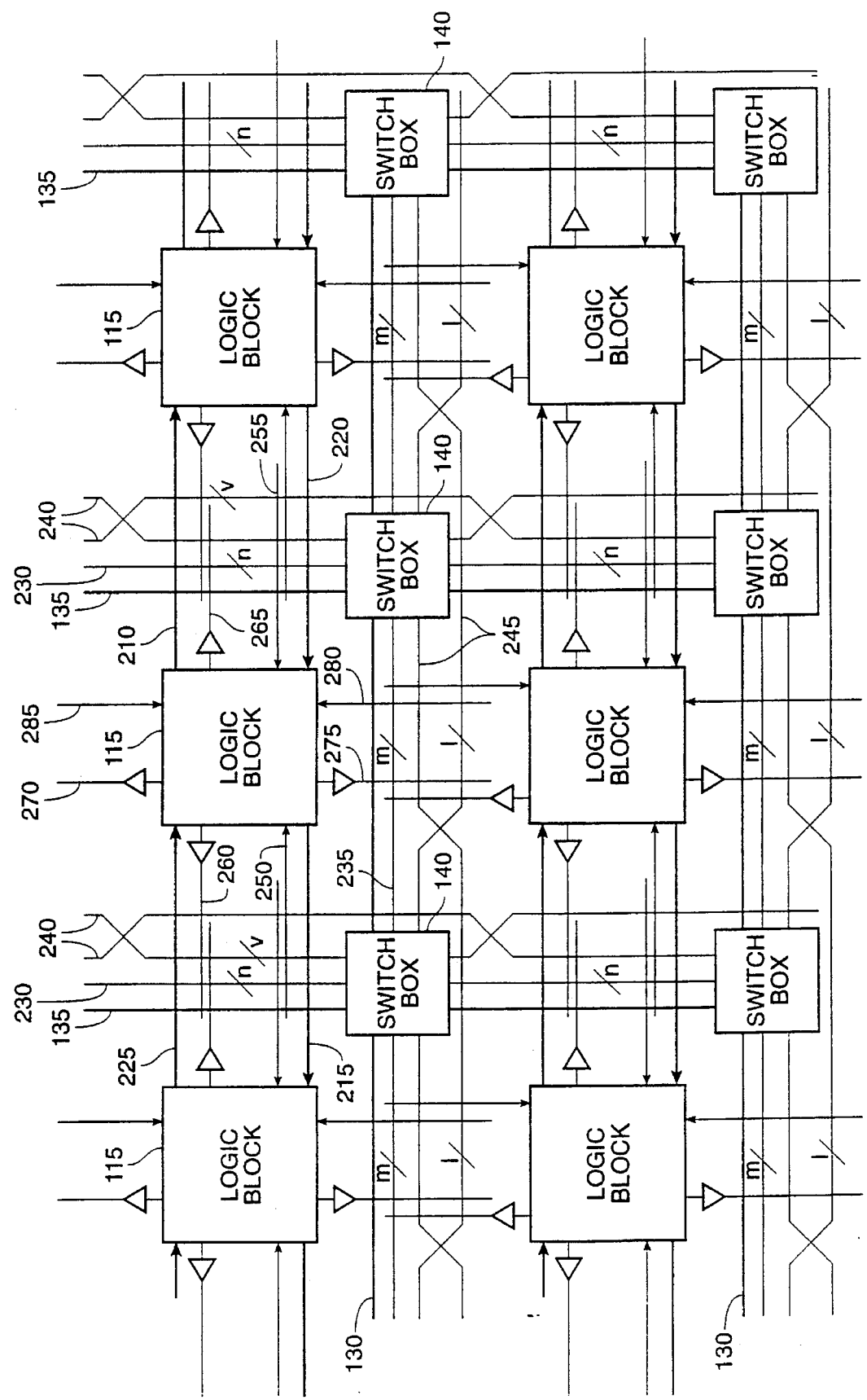
FIG. 2 shows in greater detail the architecture of a representative programmable logic device.

FIG. 2 shows in greater detail the architecture of the representative programmable logic device of FIG. 1. Logic blocks 115 are again disposed in a matrix of vertical columns and horizontal rows of logic blocks. Similarly, programmable switch boxes 140 are disposed in a matrix of programmable switch boxes. For illustrative purposes, each logic block 115 has programmable direct interconnect outputs 210 and 215, and programmable direct interconnect inputs 220 and 225, for connecting logic block 115 to adjacent logic blocks on the same row. Vertical global interconnect buses 135 and horizontal global interconnect buses 130 are disposed among the logic block matrix and form part of the network of interconnect resources available to the programmable logic device.

There are also shown a vertical single-length bus 230, which includes n lines, and a horizontal single-length bus 235, which includes m lines. Vertical single-length bus 230 connects adjacent switch boxes 140 in the same column. Similarly, horizontal single-length bus 235 connects adjacent switch boxes 140 on the same row.

FIG. 2 also shows a vertical double-length bus 240, which includes v lines, and a horizontal double-length bus 245, which includes l lines. Vertical double-length bus 240 connects two switch boxes 140 in the same column which are separated by one other switch box 140. Similarly, horizontal double-length bus 245 connects two switch boxes 140 on the same row which are separated by one other switch box 140. It is possible, if desired, to provide for triple-length buses or even longer switch-box-to-switch-box buses. For the purpose of illustrating this embodiment, those buses are omitted from FIG. 2.

As discussed in connection with FIG. 1, each global interconnect bus, such as vertical global interconnect bus 135 or horizontal global interconnect bus 130, comprises a plurality of metal lines. The programmable switch boxes 140 facilitate connection among certain metal lines of horizontal global interconnect bus 130 or vertical global interconnect bus 135 with certain metal lines of either vertical single-length bus 230, horizontal single-length bus 235, vertical double-length bus 240, or horizontal double-length bus 245. In other words, signals from either vertical global interconnect bus 135 or horizontal global interconnect bus 130 may be programmably coupled with metal lines on the single-length or double-length buses. The programmable switch boxes 140 are implemented by programmable switches such as pass transistors. The programming itself may be implemented through the use of fuses, EPROM, EEPROM, etc.

Each logic block 115 has horizontal programmable network inputs 250 and 255, and horizontal programmable network outputs 260 and 265. Horizontal programmable network inputs 250 and 255, and horizontal programmable network outputs 260 and 265 enable logic block 115 to selectively tap into vertical global interconnect bus 135, vertical single-length bus 230, or vertical double-length bus 240. A similar interconnect scheme exists for logic block 115 in the vertical direction. For example, each logic block 115 has, in the vertical direction, the vertical programmable network outputs 270 and 275, and the vertical programmable network inputs 280 and 285, which can selectively tap into horizontal global interconnect bus 130, horizontal single-length bus 235, or horizontal double-length bus 245.

Figure 3:
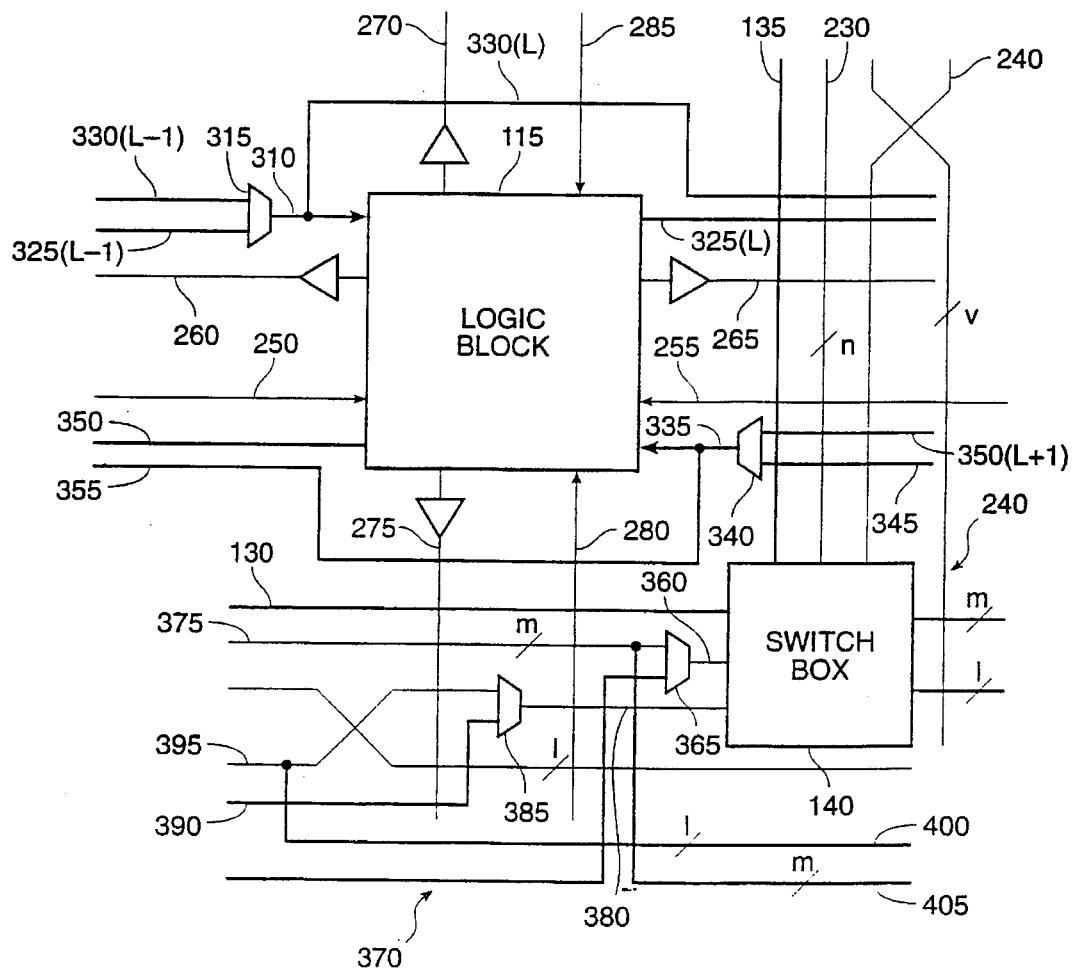
FIG. 3 shows, in one embodiment, the additional interconnect resources employed to implement redundancy.

FIG. 3 shows, in one embodiment of the invention, the simplified redundancy circuitry employed to switch out a column of logic blocks 115 which is found to contain one or more defective logic blocks. For ease of discussion, only one logic block and one switch box are shown. Furthermore, the following convention is adopted. If a given logic block 115 occupies a position L, the adjacent logic block immediately to its left is designated L−1. The logic block immediately adjacent and to the left of logic block L−1 is designated L=2. Correspondingly, the adjacent logic block immediately to the right of logic block L is designated L+1. The logic block immediately adjacent and to the right of logic block L+1 is designated L+2.

Furthermore, logic block 115 at position L has associated with it a switch box 140, whose position is designated S. The adjacent programmable switch box immediately to the left of programmable switch box S is designated S−1. The programmable switch box immediately adjacent and to the left of programmable switch box S−1 is designated S−2. Correspondingly, the adjacent programmable switch box immediately to the right of programmable switch box S is designated S+1. The programmable switch box immediately adjacent and to the right of programmable switch box S+1 is designated S+2.

In one embodiment, an extra column of logic blocks 115 is provided to replace a column of logic blocks 115, which is found to contain one or more defective logic blocks. Furthermore, an extra column of programmable switch boxes 140 is provided to replace the column of programmable switch boxes 140 associated with the replaced column of logic blocks 115. The extra column of logic blocks and the extra column of switch boxes are located along the right edge of the array. However, in accordance with the spirit of the invention, it is equally possible to provide, in addition to or in place of the spare column, an extra row of logic blocks 115 and an extra row of programmable switch boxes 140 to replace any defective row, or the terms row and column may simply be considered to be the same.

A logic block 115 at position L has a programmable direct interconnect input 310 for receiving data from a logic block on its left. This programmable direct interconnect input 310 can be selectively coupled via a programmable multiplexer 315 to either redundant direct line 330(L−1) of logic block L−1 or a direct line 325(L−1). Redundant direct line 330(L−1) of logic block L−1 is coupled to programmable direct interconnect input 310 of the logic block L−1 (not shown in FIG. 3). Direct line 325(L−1) is coupled to the output of logic block L−1. The redundant direct line 330 of logic block L couples to programmable direct interconnect input 310 of logic block L and programmable multiplexer 315 of logic block L+1. As can be readily appreciated, redundant direct line 330 facilitates redundant direct interconnect coupling from logic block L−1 to logic block L+1 should logic block L be bypassed.

Furthermore, logic block 115 at position L has a programmable direct interconnect input 335 for receiving data from a logic block on its right. This programmable direct interconnect input 335 can be selectively coupled via a programmable multiplexer 340 to either a redundant direct line 345 or a direct line 350. Redundant direct line 345 is coupled to a programmable interconnect input 335 of logic block L+1. Direct line 350 is coupled to the output of logic block L+1. Redundant direct line 355 couples to programmable direct interconnect input 335 of logic block L and the programmable multiplexer 340 of logic block L-1. As can be readily appreciated, redundant direct line 355 facilitates redundant direct interconnect coupling from logic block L+1 to logic block L-1 should logic block L be bypassed.

A programmable switch box 140 at position S has a horizontal single-length interconnect bus 360 for coupling with a programmable switch box on its left. This horizontal single-length interconnect bus 360 serves as the input bus to the programmable switch box and can be selectively coupled via a programmable multiplexer 365 to either a horizontal redundant single-length bus 370 or a horizontal direct single-length bus 375. Horizontal redundant single-length bus 370 is coupled to the horizontal direct single-length bus 375 of programmable switch box S-1 (not shown in FIG. 3). Horizontal direct single-length bus 375 of switch box S is coupled to programmable switch box S-1.

Furthermore, programmable switch box 140 at position S has a horizontal double-length interconnect bus 380 for coupling with a programmable switch box 140 on its left. This horizontal double-length interconnect bus 380 can be selectively coupled via a programmable multiplexer 385 to either a horizontal redundant double-length bus 390 or a horizontal direct double-length bus 395. Horizontal redundant double-length bus 390 is coupled to the horizontal direct double-length bus 395 of the programmable switch box S-2 (not shown in FIG. 3). Horizontal direct double-length bus 395 is coupled to the programmable switch box S-2.

FIG. 3 also shows a horizontal redundant double-length bus 400 coupled to horizontal direct double-length bus 395 of programmable switch box S to facilitate redundant double-length coupling between programmable switch box S+1 and programmable switch box S-2 should programmable switch box S be bypassed. Similarly, a horizontal redundant single-length bus 405 couples to horizontal direct single-length bus 375 to facilitate redundant single-length coupling between subsequent programmable switch box S+1 and programmable switch box S-1 should programmable switch box S be bypassed. Programmable network outputs 260, 265, 270, and 275, programmable network inputs 250, 255, 280, and 285, programmable direct interconnect outputs 325(L) and 350, global interconnect buses 130 and 135, as well as vertical single-length bus 230 and vertical double-length bus 240, function as described in connection with FIG. 2.

Figure 4:
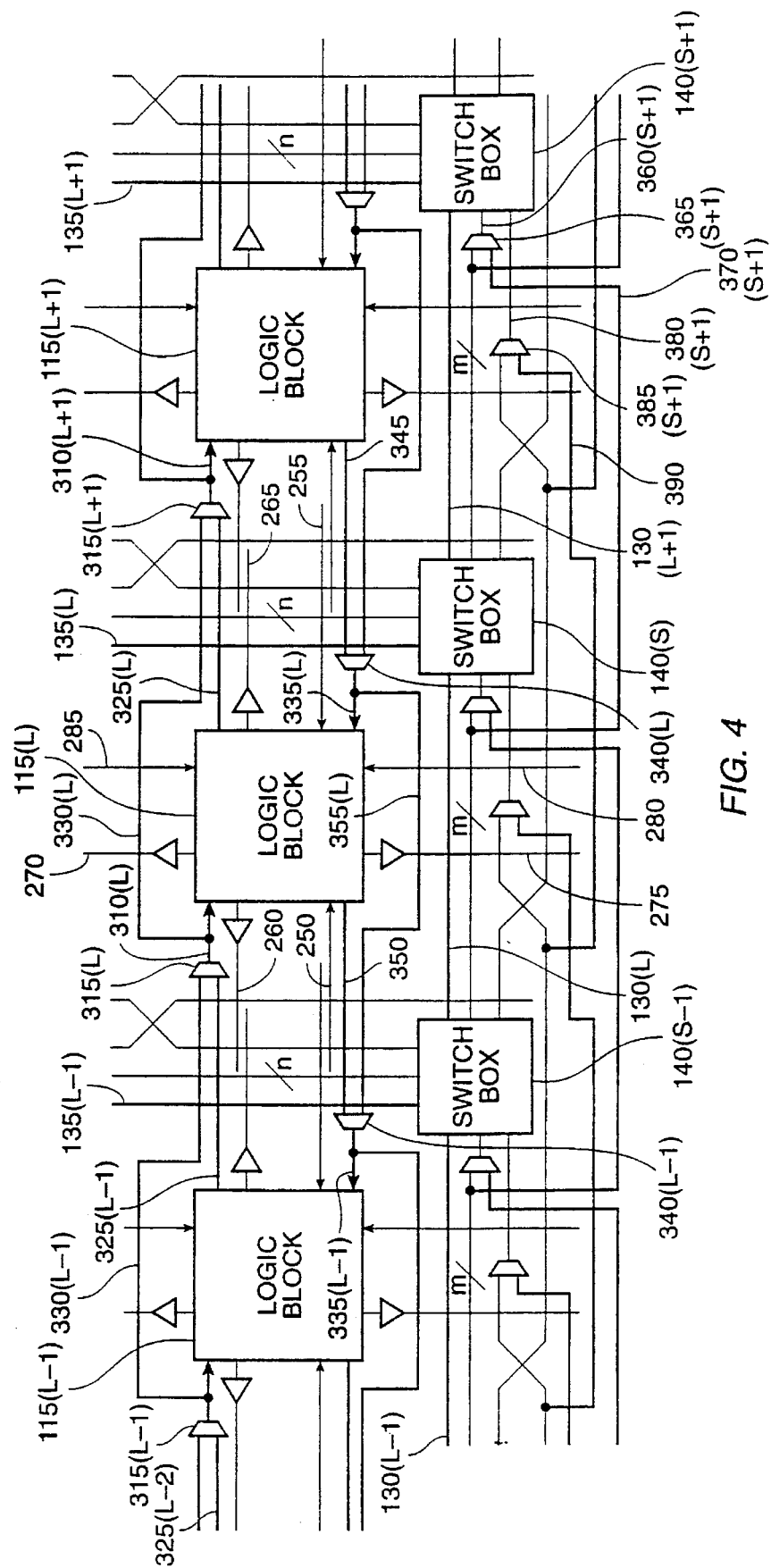
FIG. 4 shows, in one embodiment, an improved architecture for a programmable logic device having redundancy capability.

The operation of the redundant circuit described in FIG. 3 will now be discussed. FIG. 4 shows, for illustrative purposes, a simplified diagram of the improved programmable logic device comprising three logic blocks and their corresponding programmable switch boxes. In view of the earlier established convention, the middle logic block 115 is designated logic block L. The middle programmable switch box is designated programmable switch box S. Thus FIG. 4 shows three logic blocks: L-1, L, and L+1, along with three programmable switch boxes: S-1, S, and S+1. There are a redundant column of logic blocks (not shown) and an associated redundant column of programmable switch boxes at the right edge of the array (not shown in FIG. 4).

As a default, all programmable multiplexers 315 and 340 are set to couple their respective programmable direct interconnect inputs 310 and 335 to their respective direct lines 325 and 350. In other words, programmable direct interconnect inputs 310 and 335 are not coupled to their respective redundant direct lines 330(L-1) and 345 as a default. Assume for discussion purposes that the logic block 115 designated 115(L) is found to be defective. Upon detection of a defect in logic block 115(L), the entire column of logic blocks which contains the defective logic block 115(L) is bypassed.

To bypass the column of defective logic blocks, the programmable multiplexer 315(L+1) of logic block 115(L+1) is set to couple the programmable direct interconnect input 310(L+1) of logic block 115(L+1) with the redundant direct line 330(L). As a consequence, data which normally enters the programmable direct interconnect input 310(L) of logic block 115(L) now also enters programmable direct interconnect input 310(L+1) of logic block 115(L+1). Furthermore, the programmable multiplexer 340(L-1) is set to couple the programmable direct interconnect input 335(L-1) to the redundant direct line 355(L). As a consequence, data which normally enters programmable direct interconnect input 335(L) of logic block 115(L) now also enters programmable direct interconnect input 335(L-1) of logic block 115(L-1).

The configuration data destined for the logic blocks in the L column if the PLD were defect-free are now shifted to the corresponding logic blocks in the L+1 column. The configuration data originally destined for the logic blocks in the L+1 column if the PLD were defect-free are now shifted to the corresponding logic blocks in the L+2 column, and so on. Assuming the array has a total of n columns of logic blocks and one redundant column of logic blocks at its right edge, the configuration data originally destined for each logic block in the $n^{th}$ column if the PLD were defect-free are now shifted to a corresponding logic block in the redundant column of logic blocks.

For each logic block 115 in column L, the configuration data for programmable direct interconnect outputs 325(L) and 350, programmable network inputs 250, 255, 280, and 285, and for programmable network outputs 260, 265, 270, and 275 are shifted into a corresponding logic block 115 in column L+1. The configuration data originally intended for the inputs and outputs of each logic block 115 in column L+1 are shifted into a corresponding logic block 115 in column L+2, and so on. Assuming the array has a total of n columns of logic blocks and one redundant column of logic blocks at its right edge, the programming data intended for the programmable network inputs and outputs of each logic block 115 in the $n^{th}$ column are shifted into a corresponding logic block 115 in the redundant column of logic blocks.

Furthermore, the programmable multiplexer 365(S+1) of programmable switch box 140(S+1) is set to couple the horizontal single-length interconnect bus 360(S+1) of programmable switch box S+1 to the horizontal redundant single-length bus 370(S+1). Consequently, horizontal single-length interconnect bus 360(S+1) of programmable switch box 140(S+1) is coupled to programmable switch box 140(S-1), bypassing programmable switch box 140(S). Similarly, the programmable multiplexer 385(S+1) of programmable switch box 140(S+1) is set to couple the horizontal double-length interconnect bus 380(S+1) of programmable switch box 140(S+1) to horizontal redundant double-length bus 390. Consequently, horizontal double-length interconnect bus 380(S+1) of programmable switch box S+1 is coupled to programmable switch box S-2, bypassing programmable switch box S.

The data which control the pass transistors in programmable switch box 140(S) are shifted into programmable switch box 140(S+1). Programmable switch box 140(S) can then be disabled, in effect disabling any interconnection therein. The data which control the pass transistors in programmable switch box 140(S+1) are shifted into programmable switch box 140(S+2), and so on. Assuming the array has a total of n column of programmable switch boxes and one redundant column of programmable switch boxes at the right edge, the data which control the pass transistors in each programmable switch box 140 in the $n^{th}$ column are shifted into a corresponding programmable switch box 140 in the redundant column of switch boxes. The defective column of logic blocks and the associated column of programmable switch boxes are preferably filled with benign data to disconnect any connection in the logic block, thereby isolating a fault caused by a defect and preventing contention with nondefective columns.

Figure 5:
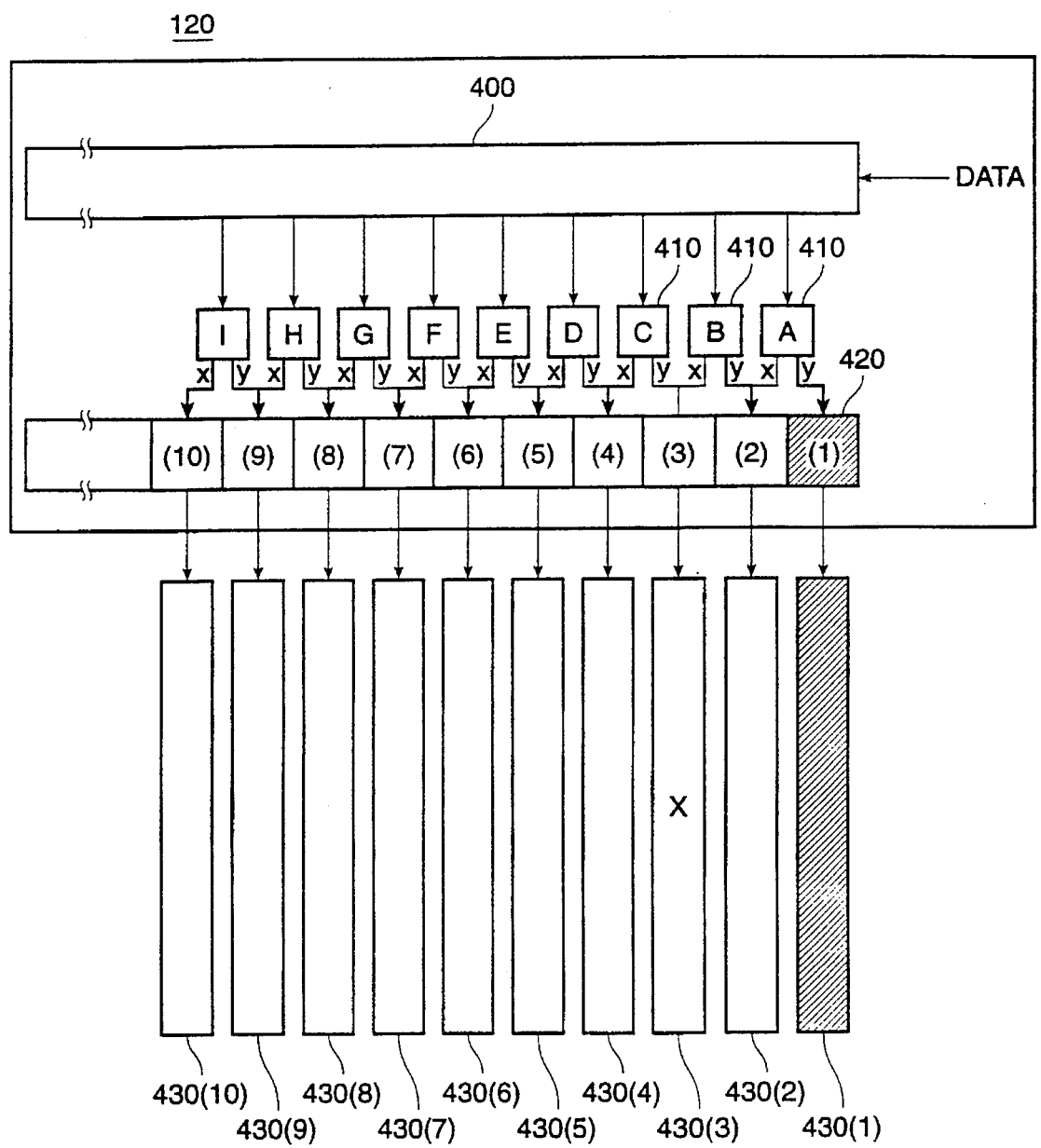
FIG. 5 shows, in one embodiment, a shifting scheme for shifting configuration data from a column of logic blocks to another column of logic blocks.

FIG. 5 shows in greater detail a shifting scheme used in one embodiment of the present invention. The shifting scheme of FIG. 5 advantageously permits configuration data destined for a column of logic blocks to shift into an adjacent column of logic blocks using minimal additional circuitry. Consequently, the present shifting scheme permits the column of logic blocks containing the defective logic block to be efficiently bypassed.

As shown in FIG. 5, data path 120 further comprises a serial register 400, a plurality of decoders 410(A)–410(I), and a parallel register 420. Each decoder 410(A)–410(J) has one input and two outputs: an X output and a Y output. Each decoder is controlled by a programmable data bit which may in turn be implemented in RAM, EPROM, EEPROM, fuses, antifuses, and the like. As a default, the data bit is programmed to couple the decoder input to the X output. There is also a redundant column, shown as column 430(1), for replacing a defective column of logic blocks within the array.

The configuration data from data path 120 implement the functions of the logic blocks in a plurality of logic block columns 430(1)–430(10). To configure the array, the configuration data stream is clocked serially into serial register 400 until the number of data bits shifted into register 400 equals a predetermined length count. Thereafter, the configuration data pass through decoders 410 to parallel register 420 and columns 430. For example, the configuration data for configuring column 430(10) pass through decoder 410(I) and parallel register 420(10) prior to entering column 430(10).

When a column of logic blocks, such as column 430(3), is found to be defective, redundant column 430(1) is switched into the matrix. The control bits on decoders 410(A)–410(B) are reprogrammed to connect their inputs to the Y outputs. Consequently, configuration data which normally enter column 430(3) are now shifted into column 430(2). Furthermore, configuration data which normally enter column 430(2) are now shifted into redundant column 430(1). Consequently, defective column 430(3) is bypassed, and redundant column 430(1) is employed. More importantly, the present shifting scheme results in negligible performance penalty. Shifting configuration data requires only a change in the contents of the decoders' programmable bits. Consequently, the resultant matrix possesses substantially identical speed performance as a matrix having no defective column. As discussed earlier, defective column 430(3) may be programmed with a predefined set of benign data to isolate the defect and to prevent possible contention with nondefective columns.

It will be understood that the foregoing is merely illustrative of the principles of the invention, and that various modifications can be made by those skilled in the art without departing from the scope and spirit of the invention. For example, although one spare column is discussed, it will be understood that two or more spare columns can be provided if desired. It is also understood that these spare columns may be placed throughout the PLD if desired. Defect repair may also be effected locally for an individual group of columns. For example, one or more spare columns may be provided for each group of columns to effect defect repair for that particular group. Alternatively, a spare column of logic blocks may be provided on either side of the array. For example, a spare column of logic blocks and a spare column of programmable switch boxes may be provided at the left edge of the matrix. Depending on the location of the spare column, the decoders are then appropriately programmed to shift the configuration data in the appropriate direction. Furthermore, it will be understood that redundancy in accordance to the scope and spirit of the invention can be achieved by providing for a spare row or a plurality of spare rows to replace defective rows. Accordingly, the foregoing disclosure is intended to be illustrative, but not limiting, of the scope of the invention which is set forth in the following claims.

What is claimed is:

1. A programmable logic device capable of remedying logic block defects, said programmable logic device comprising:

a plurality of logic blocks disposed in an array format forming rows and columns, each block performing user-specified logic functions;

a programmable interconnect for selectively connecting said logic blocks; and at least one of said columns of logic blocks replacing a selected column of logic blocks when a logic block in said selected column is defective.

2. A programmable logic device capable of remedying logic block defects, said programmable logic device comprising:

a plurality of logic blocks disposed in an array format forming rows and columns, each block performing user-specified logic functions;

a programmable interconnect for selectively connecting said logic blocks; and at least one of said columns of logic blocks replacing a selected column of logic blocks when a logic block in said selected column is defective wherein at least one logic block comprises a first input line for inputting data and a first output line for outputting data, said programmable logic device further comprising:

a first redundant line connected to said first input line and a first selector for selectively coupling said first input line to a second input line, said second input line being coupled to one adjacent logic block on the same row; and a second selector coupled to said first input line for programmably coupling said first input line either to a second redundant line or to a second output line, said second redundant line being coupled to an input line of one other adjacent logic block on the same row, said second output line being coupled to said one other adjacent logic block on the same row.

3. The programmable logic device of claim 2 further comprising a plurality of programmable switch boxes disposed in an array format forming rows and columns, at least one of said switch boxes comprising a third input line for inputting data and a third output line for outputting data, said programmable logic device further comprising:

a third redundant line connected to a fourth output line, said fourth output line being coupled to one adjacent switch box on the same row; and a third selector coupled to said third input line for programmably coupling said third input line either to said fourth output line or a fourth redundant line, said fourth redundant line being selectively coupled to an input line of said one adjacent switch box on the same row.

4. The programmable logic device of claim 1 wherein said logic block comprises a plurality of SRAM-based look-up tables.

5. The programmable logic device of claim 4 further comprising means for shifting configuration data destined for one column of logic blocks onto another column of logic blocks.

6. The programmable logic device of claim 2 wherein said logic block comprises a plurality of SRAM-based look-up tables.

7. The programmable logic device of claim 6 further comprising means for shifting configuration data destined for one column of logic blocks onto another column of logic blocks.

8. A programmable logic device capable of remedying logic block defects, said programmable logic device comprising:

a plurality of logic blocks disposed in an array format forming rows and columns, each block performing user-specified logic functions;

a programmable interconnect for selectively connecting said logic blocks; and at least one of said rows of logic blocks replacing a selected row of logic blocks when a logic block in said selected row is defective.

9. A programmable logic device capable of remedying logic block defects, said programmable logic device comprising:

a plurality of logic blocks disposed in an array format forming rows and columns, each block performing user-specified logic functions;

a programmable interconnect for selectively connecting said logic blocks; and at least one of said rows of logic blocks replacing a selected row of logic blocks when a logic block in said selected row is defective wherein at least one of said logic blocks comprises a first input line for inputting data and a first output line for outputting data, said programmable logic device further comprising:

a first redundant line connected between said first input line and a first selector for selectively coupling said first input line to a second input line, said second input line being coupled to one adjacent logic block on the same column; and a second selector coupled to said first input line for programmably coupling said first input line either to a second redundant line or to a second output line, said second redundant line being coupled to an input line of one other adjacent logic block on the same column, said second output line being coupled to said one other adjacent logic block on the same column.

10. The programmable logic device of claim 9 further comprising a plurality of programmable switch boxes disposed in an array format forming rows and columns, at least one of said switch boxes comprising a third input line for inputting data and a third output line for outputting data, said programmable logic device further comprising:

a third redundant line connected to a fourth output line, said fourth output line being coupled to one adjacent switch box on the same column; and a third selector coupled to said third input line for programmably coupling said third input line either to said fourth output line or a fourth redundant line, said fourth redundant line being selectively coupled to an input line of said one adjacent switch box on the same column.

11. The programmable logic device of claim 8 wherein said logic block comprises a plurality of SRAM-based look-up tables.

12. The programmable logic device of claim 11 further comprising means for shifting configuration data destined for one row of logic blocks onto another row of logic blocks.

13. The programmable logic device of claim 9 wherein said logic block comprises a plurality of SRAM-based look-up tables.

14. The programmable logic device of claim 13 further comprising means for shifting configuration data destined for one row of logic blocks onto another row of logic blocks.

15. A method for remedying logic block defects in a programmable logic device, said method comprising the steps of:

reserving at least one column of logic blocks for remedying logic block defects; thereafter identifying a defective logic block; and shifting a first set of configuration data for individual logic blocks of a first column of logic blocks, said first column of logic blocks containing said defective logic block and said first set of configuration data having been intended for said individual logic blocks of said first column of logic blocks had said defective logic block been defect-free, onto respective individual logic blocks of a second column of logic blocks.

* * * * *